United States Patent
Matayabas, Jr. et al.

(10) Patent No.: US 7,611,985 B2
(45) Date of Patent: Nov. 3, 2009

(54) FORMATION OF HOLES IN SUBSTRATES USING DEWETTING COATINGS

(75) Inventors: James C. Matayabas, Jr., Chandler, AZ (US); Lakshmi Supriya, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 491 days.

(21) Appl. No.: 11/533,653

(22) Filed: Sep. 20, 2006

(65) Prior Publication Data

US 2008/0070349 A1 Mar. 20, 2008

(51) Int. Cl.
*H01L 21/4763* (2006.01)
(52) U.S. Cl. .................. 438/628; 438/631; 438/637; 438/644; 257/E21.585
(58) Field of Classification Search ............. 438/628, 438/631, 637, 644, 654; 257/E21.577, E21.585
See application file for complete search history.

(56) References Cited

U.S. PATENT DOCUMENTS 5,435,732 A * 7/1995 Angulas et al. ............ 439/67
6,936,906 B2 * 8/2005 Chung et al. ............. 257/486
7,091,609 B2 * 8/2006 Matsumoto et al. ........ 257/753
7,425,745 B2 * 9/2008 Ohta ....................... 257/368
2008/0265414 A1 * 10/2008 Ho et al. .................. 257/741
2009/0155964 A1 * 6/2009 Chang et al. .............. 438/197

OTHER PUBLICATIONS

Zhang et al., "How to form regular polymer microstructures by surface-pattern-directed dewetting," Surface Science 539 (2003) 129-136.
Feng et al., "Infululence of Polymer Nanoparticles on the Dewetting of Polymer Thin Films," Aug. 30, 2005, UM Theses and Dissertations Materials & Science.
Engineering Theses and Dissertations, http://hdl.handle.net/1903/2829.

* cited by examiner

*Primary Examiner*—Tuan N. Quach
(74) *Attorney, Agent, or Firm*—Schwabe, Williamson & Wyatt, P.C.

(57) ABSTRACT

Methods and systems for forming holes in a substrate using dewetting coating are described herein.

22 Claims, 5 Drawing Sheets

FORMATION OF HOLES IN SUBSTRATES USING DEWETTING COATINGS

TECHNICAL FIELD

Embodiments of the present invention relate to the field of electronic device manufacturing, more specifically, to methods and systems for forming holes in substrates.

BACKGROUND

In the current state of electronic device manufacturing, integrated circuits are commonly formed on and within multilayered substrates. During various stages of the formation of such substrates, cavities or holes are typically created in the substrates in order to form various electronic components including, for example, conductive interconnects such as vias. Currently, various approaches may be employed in order to form such holes including, for example, laser drilling.

Employing such techniques for creating holes, however, can be fairly expensive because of the cost of laser equipment and replacement of lasers and lenses. Further, such laser processes are relatively limited as they are limited to formation of holes having diameters that are 60 µm or greater. Furthermore, as electronic components become smaller and smaller and the density of such components in circuit substrate increases, the cost of employing such processes for forming holes have also increased.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF THE INVENTION

Figure 1:
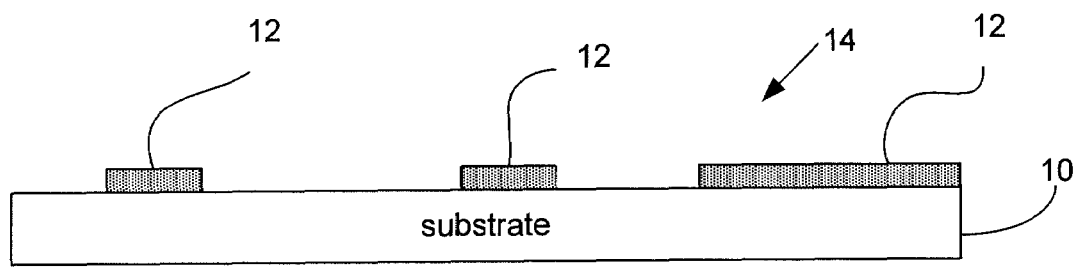
FIG. 1 illustrates a patterned substrate in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrase "A/B" means A or B. For the purposes of the present invention, the phrase "A and/or B" means "(A), (B), or (A and B)." For the purposes of the present invention, the phrase "at least one of A, B and C" means "(A), (B), (C), (A and B), (A and C), (B and C) or (A, B and C)." For the purposes of the present invention, the phrase "(A)B" means "(B) or (AB)," that is, A is an optional element.

The description may use the phrases "in various embodiments," or "in some embodiments," which may each refer to one or more of the same or different embodiments. Furthermore, the terms "comprising," "including," "having," and the like, as used with respect to embodiments of the present invention, are synonymous.

According to various embodiments of the present invention, methods and systems are provided for forming holes in a substrate using dewetting coatings. For the embodiments, a dewetting coating may refer to a coating that comprises a material that prevents other materials, with which it is incompatible, from adhering or attaching onto it. In some embodiments of the present invention, the holes that are formed may be substantially cylindrical in shape and have diameters less than or equal to about 50 µm, which are substantially impossible to form under the prior art, using e.g. laser technology. Such holes may, in some instances be used to form conductive interconnects such as vias.

In order to form one or more holes in a substrate, a substrate may be initially provided. In some embodiments of the present invention, the substrate may be a patterned substrate while in other embodiments the substrate may be an unpatterned substrate. Dewetting coating may then be placed at one or more selected locations on a surface of the substrate leaving one or more unselected locations of the surface of the substrate uncoated. A dielectric layer may then be deposited on the coated and uncoated locations of the surface of the substrate. After depositing the dielectric layer, one or more holes may be preliminarily formed in portions of the dielectric layer over the one or more selected locations with dielectric layer lips disposed around each of the one or more preliminarily formed holes. After the one or more holes are preliminarily formed, the dielectric layer lips may be removed in order to form one or more finalized holes. In some embodiments of the present invention, the holes may then be filled with conductive material to form one or more vias.

In various embodiments of the present invention, a system that includes, among other things, a coating unit, a deposition unit, a thermal unit, and an etching unit may be employed in order to form the holes as described previously. These and other aspects of embodiments of the present invention will be described in greater detail below.

FIGS. 1 to 8 depict various stages of forming vias in a substrate by forming holes in the substrate using dewetting coating in accordance with various embodiments of the present invention. In particular, FIG. 1 depicts a patterned substrate 10 with a surface 14 that includes conductive interconnects 12. The phrase "conductive interconnect" as used herein refers to a broad range of conductive terminals such as vias, metal lines, traces, pads, and so forth. Note that the conductive interconnect 12 on the right side is elongated because it represents, for example, the side view of a metal line or trace. Although not depicted, in some embodiments of the present invention, the substrate 10 may include additional conductive interconnects and/or other electronic components.

Figure 2:
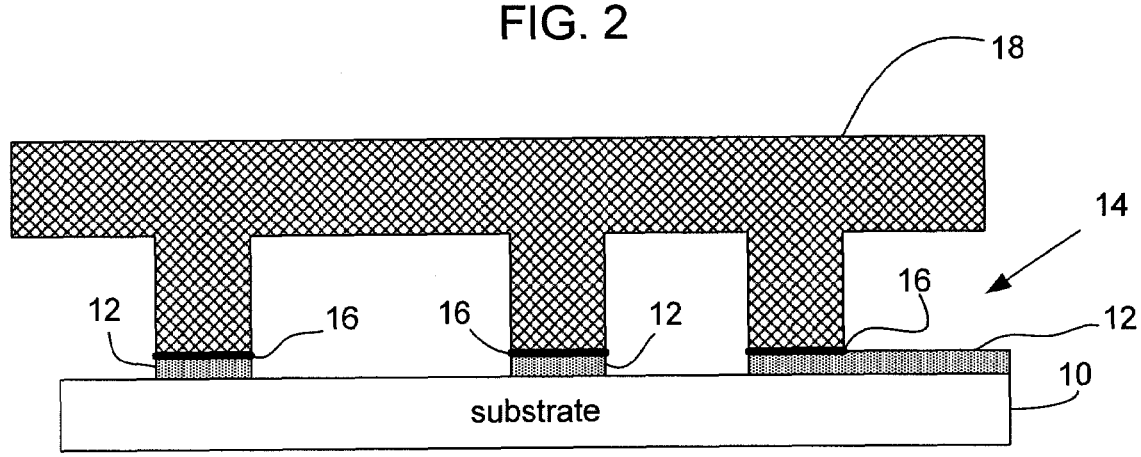
FIG. 2 illustrates a stamp depositing dewetting coating onto selected locations on the surface of the substrate of FIG. 1 in accordance with various embodiments of the present invention.

FIG. 2 depicts a stamp 18 placing dewetting coating 16 at selected locations on the surface 14 of the substrate 10, while leaving unselected locations on the surface 14 of the substrate 10 uncoated. In particular, and as depicted, the dewetting coating 16 is stamped onto selected locations on the conductive interconnects 12. In various embodiments of the present invention, the dewetting coating may comprise surfactants such as trimethoxysilane surfactants, thiol surfactants, alcohol surfactants, and so forth. Alternatively, the dewetting coating may comprise of alkoxysilanes such as octadecyltrichlorosilane, heptadecafluoro 1,1,2,2, tetrahydrodecyl trichlorosilane. In still other embodiments, the dewetting coating may comprise n-alkanethiol. In some embodiments, the dewetting coating may include nanomaterials such as silica and titania, dispersed in a solvent or a polymer matrix, wherein the polymer matrix may be an epoxy, a polyimide, a polyester, and so forth. In some alternative embodiments of the present invention, rather than using a stamp 18 to deposit the dewetting coating 16 at selected locations on the surface 14 of the substrate 10, the dewetting coating 16 may be deposited by immersion coating and patterned by ultraviolet (UV) lithography.

In some embodiments of the present invention, prior to placing the dewetting coating 16 at selected locations on the surface 14 of the substrate 10, the locations on the surface 14 of the substrate 10 where the dewetting coating 16 is to be placed may be initially roughened using, for example, a plasma etching process such as a Desmear process. This may, in some instances, facilitate the formation of holes above those locations in subsequent operations as will be described below.

Figure 3:
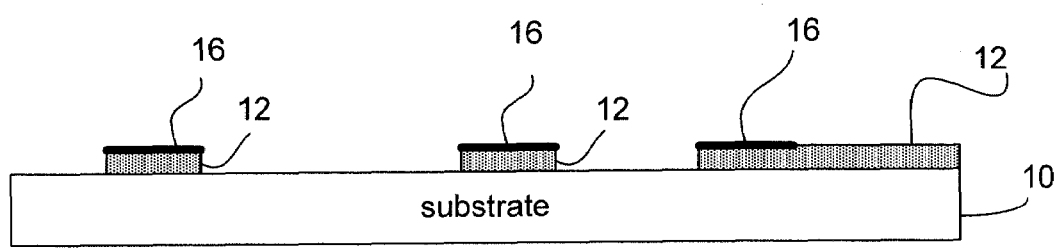
FIG. 3 illustrates the substrate of FIG. 2 after the stamp has been removed in accordance with various embodiments of the present invention.
Figure 4:
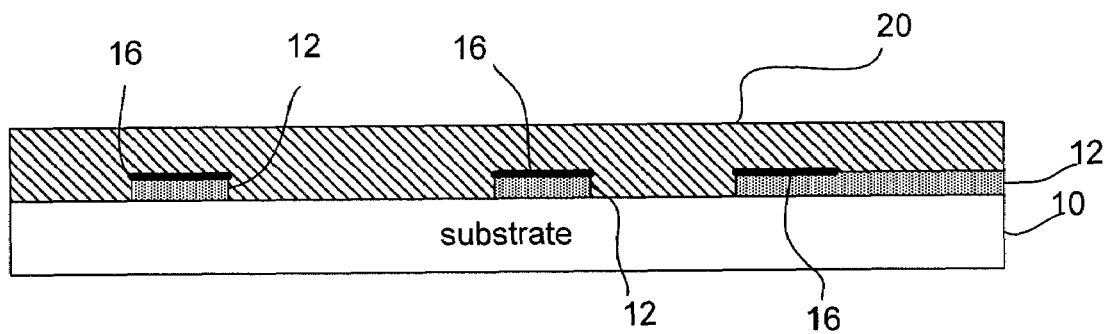
FIG. 4 illustrates a dielectric layer disposed on the substrate of FIG. 3 in accordance with various embodiments of the present invention.

Once the dewetting coating 16 has been placed at the selected locations, the stamp 18 is removed as depicted in FIG. 3. Next, a dielectric layer 20 may be deposited onto the selected (i.e., dewetting coating 16) and unselected locations of the substrate 10 as depicted in FIG. 4. The dielectric layer 20 may be deposited such that the dielectric layer 20 has a substantially planar surface located opposite of the substrate 10. A wide variety of methods may be used to deposit the dielectric layer 20 uniformly onto the substrate 10 including, for example, vacuum lamination, spin coating, and so forth. The dielectric layer 20 may comprise a polyimide, a polyester, a polyamide, a polyolefin, an epoxy, a bismaleimide, and so forth.

Figure 5:
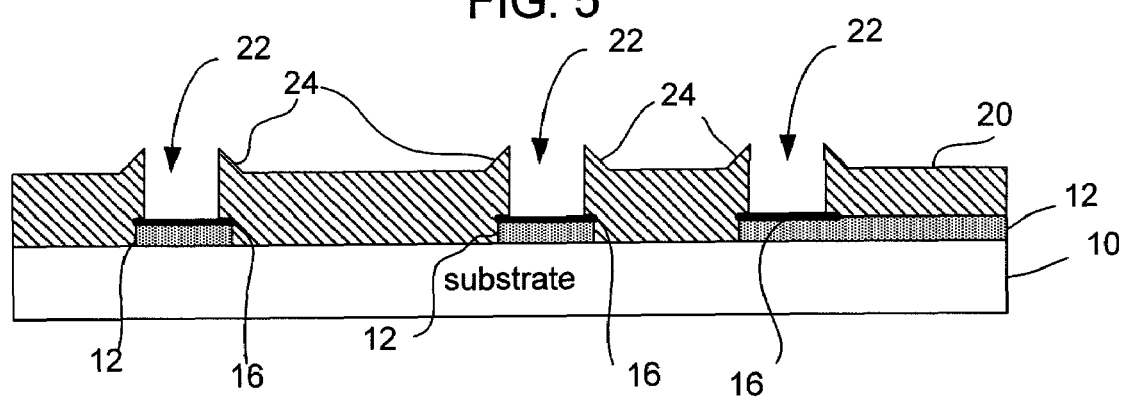
FIG. 5 illustrates holes formed preliminarily in portions of the dielectric layer disposed on the substrate of FIG. 4 in accordance with various embodiments of the present invention.

The substrate 10 may then be thermally treated to form, preliminarily, holes 22 in the portions of the dielectric layer 20 above the dewetting coating 16 as depicted in FIG. 5. If the selected locations were roughened as previously described, such roughing may facilitate the formation of the holes 22.

Formed along with the holes 22 are dielectric layer lips 24 around the holes 22 and on top of the dewetting coating 16. The dielectric layer lips 24 may comprise the same material comprising the dielectric layer 20 and may protrude above the planar surface of the dielectric layer 20 and on top of the dewetting coating 16. In various embodiments of the present invention, the temperature and the length of the thermal treatment may depend upon the compositions and thickness of the dielectric layer 20 and the dewetting coating 16.

In some embodiments of the present invention, the holes 22 may be spontaneously generated by the thermal treatment. Alternatively, the formation of the holes 22 may be initiated using various methods. For example, in a first method, air may be blown over the entire substrate in order to initiate the hole formations. In a second method, air may be blown perpendicular to and directly at the points where hole formations are desired. The first two techniques may cause waves to form on portions of the dielectric layer 20 that is on top of the dewetting coating 16, which may initiate the dewetting process. In a third method, capillary suction may be employed at the specified locations (i.e., at the portions of the dielectric layer 20 above the dewetting coating 16). And in a fourth method, a pin may be used to poke or prick the specified locations. For the embodiments, these initiating procedures may be performed either just prior to the thermal treatment or during the thermal treatment.

Figure 6:
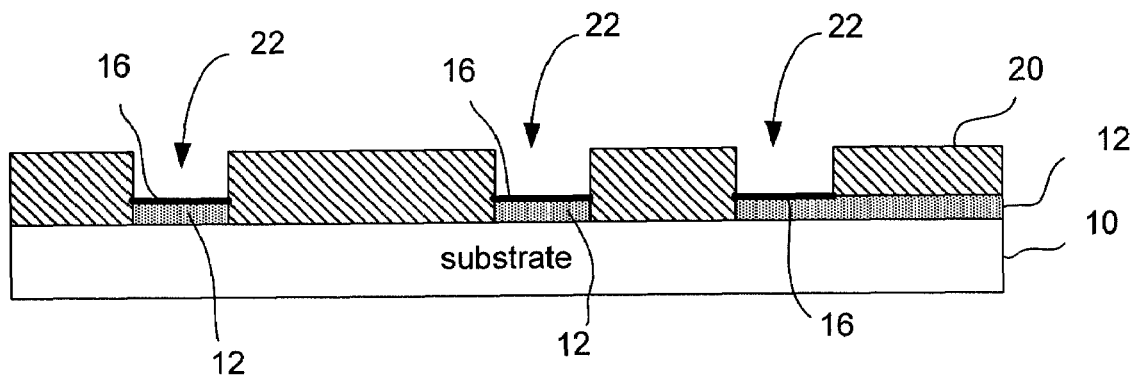
FIG. 6 illustrates finalized holes formed in portions of the dielectric layer disposed on the substrate of FIG. 5 in accordance with various embodiments of the present invention.

After the preliminarily formations of the holes 22, the dielectric layer lips 24 may be removed to form finalized holes 22 as depicted in FIG. 6. In some embodiments of the present invention, the removal of the dielectric layer lips 24 may include only the removal of the portions of the dielectric layer lips 24 protruding above the planar surface of the dielectric layer 20, or alternatively, the removal of all of the dielectric layer lips 24 that is on top of the dewetting coating 16 as depicted in FIG. 6. The removal of the dielectric layer lips 24 may be needed in order to assure that the dielectric layer 20 is planarized and/or to remove the excess dielectric material on top of the dewetting coating 16 because such excess dielectric material may not attach very well to the underlying dewetting coating 16 and may eventually break off. Various methods may be used to remove the dielectric layer lips 24 including, for example, plasma etching such as a Desmear process.

Figure 7:
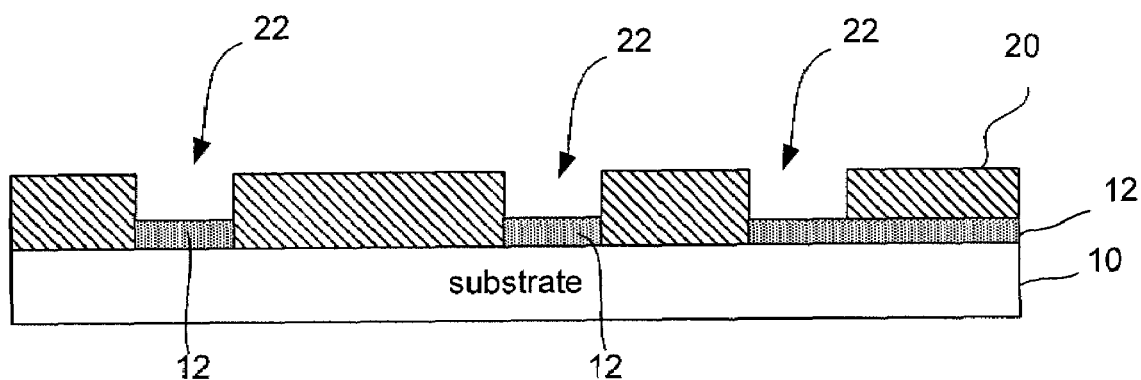
FIG. 7 illustrates finalized holes of FIG. 5 without dewetting coating at the bottom of the holes in accordance with various embodiments of the present invention.

Next, the dewetting coating 16 at the bottom of the holes 22 may be removed as depicted in FIG. 7. In some embodiments of the present invention, the dewetting coating 16 may be either washed away or evaporated away by exposing the dewetting coating 16 to UV light (e.g., if the dewetting coating 16 is made of material that reacts with UV light). Alternatively, if the dewetting coating 16 is not reactive to UV light, it may be removed using, for example, plasma etching. In still other alternative embodiments, the dewetting coating 16 may be left at the bottom of the holes 22 particularly if, for example, the dewetting coating 16 is made of material that is electrically conductive or if it is not necessary to have the bottom of the holes 22 be electrically conductive (e.g., if the holes to be formed are not for formations of vias that are to be coupled to underlying conductive interconnects).

Figure 8:
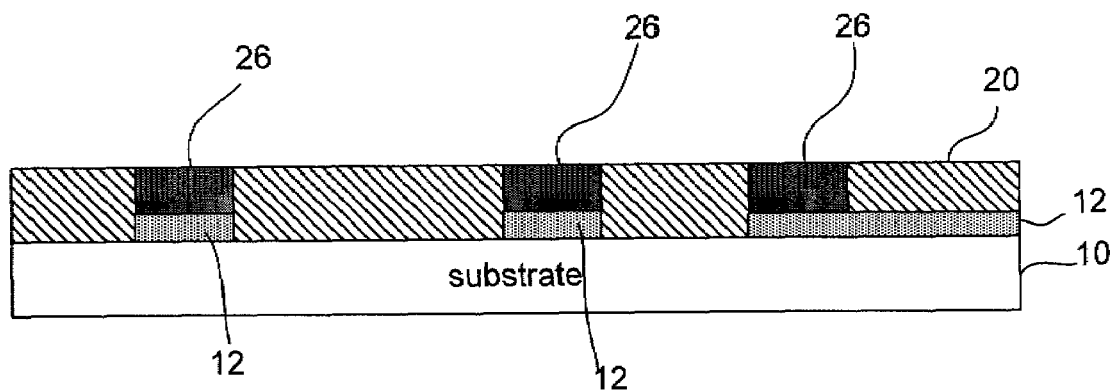
FIG. 8 illustrates the finalized holes of FIG. 7 filled with conductive material in accordance with various embodiments of the present invention.

After removing the dewetting coating 16 from the bottom of the holes 22, the holes 22 may be filled with conductive material 26 to form vias (conductive terminals) as depicted in FIG. 8. In some embodiments, the formed vias may have diameters that are equal to or less than about 50 μm. The conductive material 26 used to fill the holes 22 may be one of a variety of materials including, for example, copper, aluminum, silver, gold, and so forth. Although the holes 22 are depicted as being completely filled, in alternative embodiments of the present invention, the holes 22 may only be plated with a conductive material 26. Once the vias or conductive terminals are formed, additional patterning of the substrate 10 may be subsequently performed. Note that in alternative embodiments of the present invention and as previously described, the dewetting coating 16 may be left trapped at the bottom of the holes 22 underneath the conductive material 26.

Figure 9:
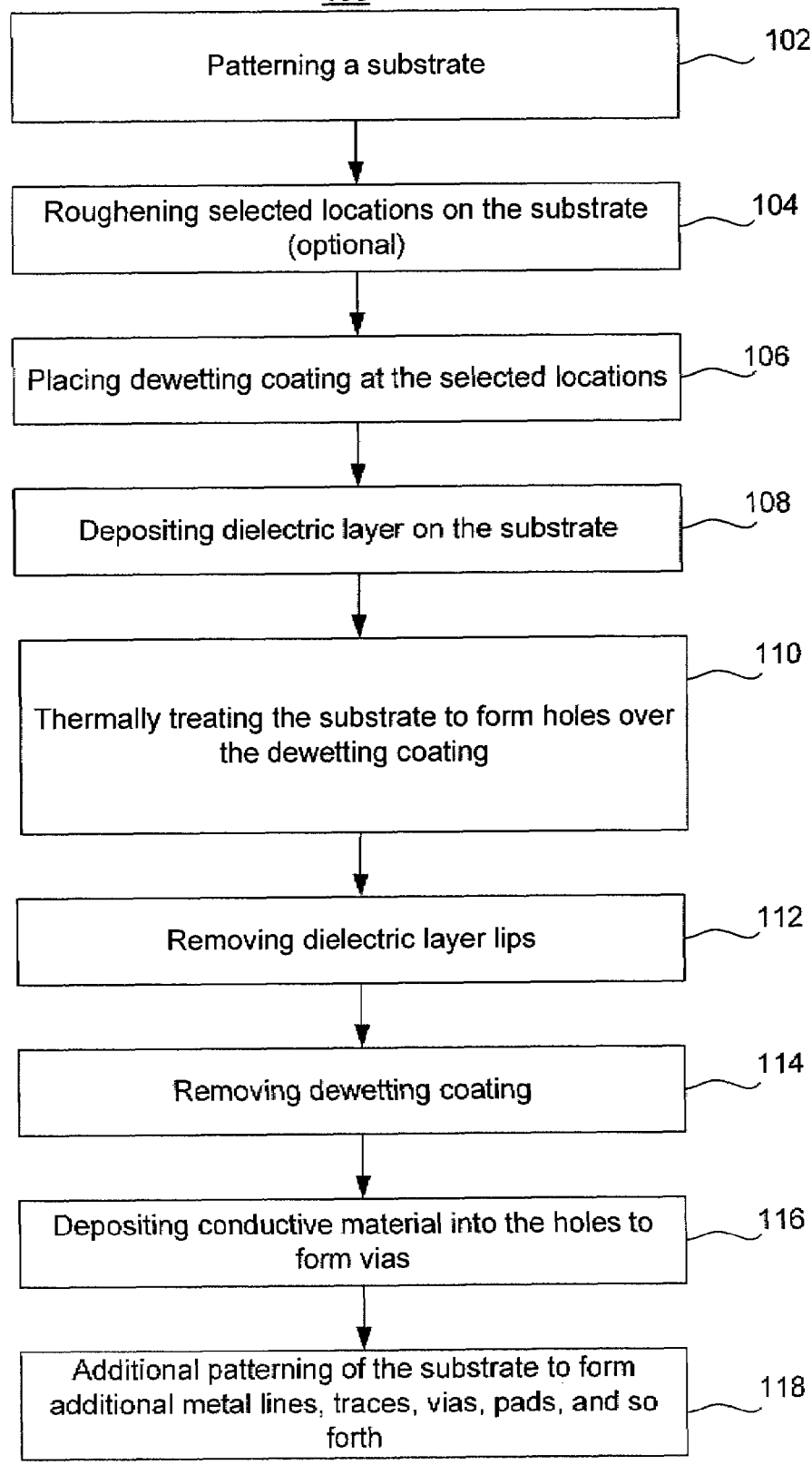
FIG. 9 illustrates a process for forming vias in a substrate in accordance with various embodiments of the present invention.

FIG. 9 depicts a process that generally corresponds to the process described previously in accordance with various embodiments of the present invention. For the embodiments, the process 100 may begin when a substrate is patterned at 102. After patterning the substrate, one or more selected locations on the substrate may be roughened at 104. In some embodiments of the present invention, the one or more selected locations may be one or more selected locations located on the surfaces of conductive interconnects that may be disposed on the substrate.

Next, dewetting coatings may be placed at the one or more selected locations while leaving unselected locations on the substrate uncoated at 106. A dielectric layer may then be deposited on the substrate on both the selected and unselected locations at 108. The substrate may then be thermally treated to form, preliminarily, one or more holes in portions of the dielectric layer over the one or more selected locations at 110. In various embodiments of the present invention, the hole formations may be initiated using one or more of various alternative methods (e.g., air blowing, capillary suction, and pin poking). In preliminarily forming the one or more holes in the dielectric layer, dielectric layer lips may form around the one or more holes and on top of the dewetting coating.

Subsequently, the dielectric layer lips may be removed to form one or more finalized holes at 112. The dewetting coating at the one or more selected locations may then be removed from the bottom of the holes at 114. A conductive material may then be deposited into the one or more holes to form one or more vias at 116. After the one or more vias are formed, additional patterning of the substrate may be performed at 118. Note that one or more of the above described operations such as the roughening of the selected locations and removing the dewetting coating may be eliminated from the process 100 in various alternative embodiments of the present invention. Further, additional operations may be included in the process 100 in other embodiments of the present invention. Although this process 100 is directed to the formation of holes for via formation, the general process for forming holes as described above may be applied to formation of holes for other purposes.

Figure 10:
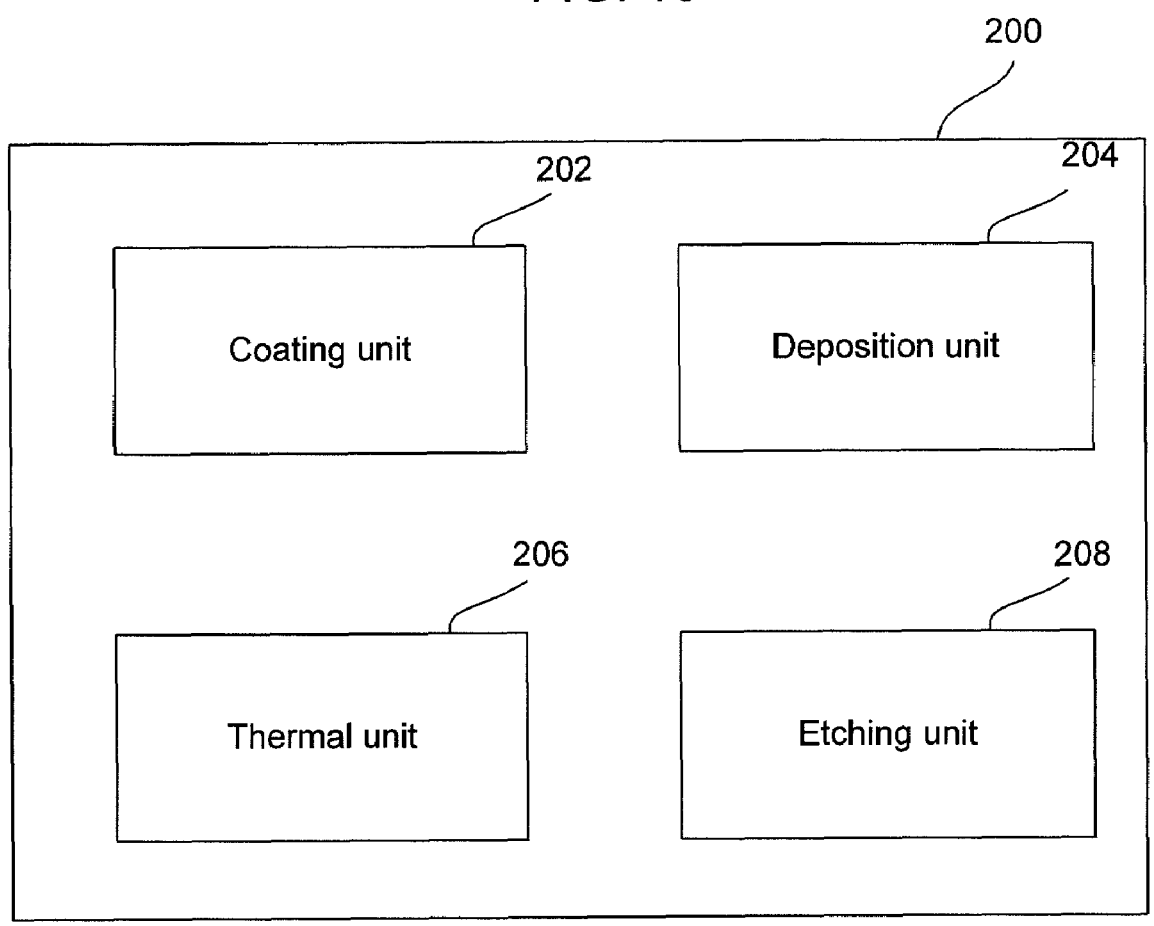
FIG. 10 illustrates a system in accordance with various embodiments of the present invention.

FIG. 10 depicts a system for forming holes in accordance with various embodiments of the present invention. The system 200 includes a coating unit 202, a deposition unit 204, a thermal unit 206, and an etching unit 208, as shown. The system 200 may be adapted to implement the processes described above. For example, the coating unit 202 may selectively place a dewetting coating at one or more selected locations on a surface of a substrate while leaving one or more unselected locations of the surface of the substrate uncoated. The deposition unit 204 may then deposit a dielectric layer on the coated and uncoated locations of the surface of the substrate. The thermal unit 206 may then thermally treat the substrate to form preliminarily one or more holes in portions of the dielectric layer over the one or more selected locations with dielectric layer lips disposed around each of the one or more preliminarily formed holes. And the etching unit 208 may then remove the dielectric layer lips to contribute towards finalized formation of the one or more holes. In some embodiments of the present invention, the coating unit 202 is a stamping unit for stamping dewetting coating at the one or more selected locations on the surface of the substrate or an immersion coating and UV lithography unit for placing the dewetting coating at the one or more selected locations on the surface of the substrate.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method, comprising:
   placing dewetting coating at one or more selected locations on a surface of a substrate and leaving one or more unselected locations of the surface of the substrate uncoated;
   depositing a dielectric layer on the coated and uncoated locations of the surface of the substrate;
   forming preliminarily one or more holes in portions of the dielectric layer over the one or more selected locations with dielectric layer lips disposed around each of the one or more preliminarily formed holes; and
   finalizing formation of the one or more holes including removing the dielectric layer lips.

2. The method of claim 1, further comprising roughening the one or more selected locations on the surface of the substrate prior to said placing.

3. The method of claim 1, wherein said placing comprises placing the dewetting coating at the one or more selected locations on the surface of the substrate by stamping the dewetting coating onto the surface or by placing the dewetting coating onto the surface by immersion coating and subsequent ultraviolet (UV) lithography to place the dewetting coating at the one or more selected locations.

4. The method of claim 1, wherein said preliminary forming comprises forming preliminarily the one or more holes by thermally heating the substrate.

5. The method of claim 4, further comprising initiating said preliminary forming of the one or more holes by blowing air over the substrate, by blowing air at the portions of the dielectric layer over the one or more selected locations of the substrate from a direction orthogonal to the dielectric layer, by capillary suction of the portions of the dielectric layer over the one or more selected locations of the substrate, and/or by poking the portions of the dielectric layer over the one or more selected locations of the substrate with one or more pins.

6. The method of claim 1, wherein said placing comprises placing dewetting coating comprising surfactants selected from the group consisting of trimethoxysilane surfactants, thiol surfactants, and alcohol surfactants.

7. The method of claim 1, wherein said placing comprises placing dewetting coating comprising a nanomaterial selected from the group consisting of silica and titania, dispersed in a solvent or a polymer matrix.

8. The method of claim 7, wherein said nanomaterial is dispersed in a polymer matrix selected from the group consisting of epoxy, polyimide, and polyester.

9. The method of claim 1, wherein said placing comprises placing dewetting coating comprising of alkoxysilanes selected from the group consisting of octadecyltrichlorosilane, heptadecafluoro 1,1,2,2, tetrahydrodecyl trichlorosilane.

10. The method of claim 1, wherein said placing comprises placing dewetting coating comprising n-alkanethiol.

11. The method of claim 1, wherein said dielectric layer has a substantially planar surface opposite the substrate, said dielectric layer lips comprise dielectric material protruding above said planar surface, and said removing comprises removing said protruding dielectric material.

12. The method of claim 11, wherein said dielectric layer lips further comprise dielectric material on top of the dewetting coating at the one or more selected locations and said removing comprises removing said dielectric material on top of the dewetting coating at the one or more selected locations.

13. The method of claim 1, further comprising removing the dewetting coating at the one or more locations.

14. A method, comprising:
  placing dewetting coating at one or more selected locations on a surface of a substrate, and leaving one or more unselected locations of the surface of the substrate uncoated;
  depositing a dielectric layer on the coated and uncoated locations of the surface of the substrate;
  forming one or more holes in portions of the dielectric layer over the one or more coated locations including removal of the coatings; and
  depositing conductive material into the one or more holes to form one or more conductive interconnects.

15. The method of claim 14, wherein said substrate comprises one or more conductive interconnects on the surface of the substrate and said placing comprises placing the dewetting coating on the one or more conductive interconnects.

16. The method of claim 14, wherein said forming comprises forming one or more holes having widths that are less than or equal to about 50 µm.

17. The method of claim 14, wherein said removing of the dewetting coatings at the one or more locations is performed prior to said depositing of the conductive material.

18. A method, comprising:
  patterning a substrate to form one or more conductive interconnects;
  placing dewetting coating at one or more selected locations on a surface of the substrate, leaving one or more unselected locations uncoated;
  depositing a dielectric layer on the selected and unselected locations of the surface of the substrate;
  forming preliminarily one or more holes in portions of the dielectric layer over the one or more selected locations with dielectric layer lips disposed around each of the one or more preliminarily formed holes; and
  finalizing forming of the one or more holes including removing the dielectric layer lips.

19. The method of claim 18, wherein said removing is by plasma etching.

20. The method of claim 18, further comprising depositing conductive material into the one or more finally formed holes, the conductive material selected from the group consisting of copper, aluminum, silver, and gold.

21. The method of claim 18, wherein said depositing a dielectric layer comprises depositing a dielectric material selected from the group consisting of a polyimide, a polyester, a polyamide, a polyolefin, an epoxy, and a bismaleimide.

22. The method of claim 18, further comprising patterning the substrate to form one or more additional conductive interconnects following said removing.

* * * * *

UNITED STATES PATENT AND TRADEMARK OFFICE
CERTIFICATE OF CORRECTION

PATENT NO. : 7,611,985 B2 Page 1 of 1
APPLICATION NO. : 11/533653
DATED : November 3, 2009
INVENTOR(S) : Matayabas, Jr. et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 535 days.

Signed and Sealed this

Nineteenth Day of October, 2010

David J. Kappos
*Director of the United States Patent and Trademark Office*